United States Patent
Shih et al.

(10) Patent No.: US 6,387,761 B1
(45) Date of Patent: May 14, 2002

(54) ANNEAL FOR ENHANCING THE ELECTRICAL CHARACTERISTIC OF SEMICONDUCTOR DEVICES

(75) Inventors: Wong-Cheng Shih, Hsinchu (TW); Pravin K. Narwankar, Sunnyvale, CA (US); Randall S. Urdahl, Mountain View, CA (US); Turgut Sahin, Cupertino, CA (US)

(73) Assignees: Applied Materials, Inc., Santa Clara, CA (US); Vanguard Semiconductor, Ltd., Hsinchu (TW)

( * ) Notice: Subject to any disclaimer, the term of this patent is extended or adjusted under 35 U.S.C. 154(b) by 0 days.

(21) Appl. No.: 09/499,336

(22) Filed: Feb. 4, 2000

Related U.S. Application Data

(63) Continuation of application No. 09/152,871, filed on Sep. 14, 1998, now Pat. No. 6,037,235.

(51) Int. Cl.$^7$ ............... H01L 21/8238; H01L 21/8234; H01L 21/336; H01L 21/3205; H01L 21/4763
(52) U.S. Cl. ............ 438/287; 438/591; 438/197; 438/216; 438/261; 438/791
(58) Field of Search .................. 438/791, 778, 438/785, 239, 240, 216, 591, 585, 197, 261, 287, 79, FOR 193

(56) References Cited

U.S. PATENT DOCUMENTS

| 4,983,544 | A | | 1/1991 | Lu et al. |
| 5,405,801 | A | | 4/1995 | Han et al. |
| 5,550,091 | A | | 8/1996 | Fukuda et al. |
| 5,591,681 | A | | 1/1997 | Wristers et al. |
| 5,629,043 | A | | 5/1997 | Inaba et al. |
| 5,716,875 | A | * | 2/1998 | Jones, Jr. et al. ............... 438/3 |

OTHER PUBLICATIONS

Wolf, S. and Tauber, R.N.; Silicon Processing for the VLSI Era; vol. 1; Lattice Press; Sunset Beach, CA.; p. 194.

* cited by examiner

*Primary Examiner*—George Fourson
*Assistant Examiner*—Neal Berezny
(74) *Attorney, Agent, or Firm*—Blakely Sokoloff Taylor & Zafman

(57) ABSTRACT

A method for improving the interface between a silicon nitride film and a silicon surface is described. According to the present invention a silicon nitride film is formed on a silicon surface of a substrate. While said substrate is heated the silicon nitride film is exposed to an ambient comprising hydrogen ($H_2$). In a prefered embodiment of the present invention the ambient comprises $H_2$ and $N_2$.

10 Claims, 7 Drawing Sheets

ANNEAL FOR ENHANCING THE ELECTRICAL CHARACTERISTIC OF SEMICONDUCTOR DEVICES

This is a Divisional Application of Serial No.: 09/152,871 filed Sep. 14, 1998, which is now U.S. Pat. No. 6,037,235.

BACKGROUND OF THE INVENTION

1. Field of the Invention

The present invention relates to the field of semiconductor manufacturing and more specifically to a method and apparatus for improving the electrical characteristic of semiconductor devices.

2. Discussion of Related Art

Integrated circuits are made up of literally millions of active and passive devices such as transistors, capacitors and resistors. In order to provide more computational power and/or more storage capability in an integrated circuit, device features are reduced or scaled down in order to provide higher packing density of devices. An important feature to enable scaling of devices is the ability to form high quality, high dielectric constant films for capacitor and gate dielectrics.

High dielectric constant films are generally ceramic films (i.e., metaloxides) such as tantalum pentaoxide and titanium oxide. When these films are deposited they tend to have vacancies at the anionic (oxygen) sites in the lattice. Presently these vacancies are filled by annealing the film in an oxygen containing gas. However, such an anneal causes the oxidation of the underlying polysilicon electrode in the case of a capacitor and the oxidation of the underlying silicon substrate in the case of a MOS transistor. Such an oxidation of the underlying silicon layer causes the formation of a silicon dioxide film in series with the high dielectric constant film which in turn reduces the effective dielectric constant of the combined film.

As such, in order to integrate a high dielectric constant film, such as tantalum pentaoxide, into a capacitor or MOS fabrication scheme, it has been found important to form a silicon nitride barrier layer between the high dielectric constant material and the silicon surface in order to prevent oxidation of the underlying silicon surface and a corresponding reduction in the effective capacitance of the device. The silicon nitride barrier layer, however, needs to be formed thin, between 10–25 Å, so that its low dielectric constant does not decrease the effective dielectric constant of the high dielectric constant film. Additionally, the silicon nitride film needs to be formed at low temperatures, less than 950° C., in order to keep the thermal budget of the fabrication process low. Unfortunately, however, a thin silicon nitride layer formed at a low nitridation temperature creates a poor quality barrier to oxygen diffusion. Additionally, defects such as dangling bonds can be created at the silicon nitride/silicon surface interface. Such dangling bonds can lead to poor device performance such as increased leakage currents and reduced capacitance.

Thus, what is needed is a method of forming a thin robust silicon nitride barrier layer at a relatively low temperature and a method which can cure defects at the silicon nitride/silicon surface interface.

SUMMARY OF THE INVENTION

A method for improving the interface between a silicon nitride film and a silicon surface is described. According to the present invention a silicon nitride film is formed on a silicon surface of a substrate. While said substrate is heated the silicon nitride film is exposed to an ambient comprising hydrogen ($H_2$). In a prefered embodiment of the present invention the ambient comprises $H_2$ and $N_2$.

DETAILED DESCRIPTION OF THE PRESENT INVENTION

The present invention describes a novel method and apparatus for enhancing the electrical characteristics of semiconductor devices. In the following description numerous specific details such as specific equipment, and process parameters are set forth in order to provide a thorough understanding of the present invention. One skilled in the art will appreciate the ability to use alternative configurations and process details to the disclosed specifics without departing from the scope of the present invention. In other instances, well known semiconductor processing equipment and methodology have not been described in detail in order to not unnecessarily obscure the present invention.

The present invention is a forming gas anneal which enhances the electrical properties of semiconductor devices. According to the present invention, a thin silicon nitride film is formed on a silicon surface, such as but not limited to a monocrystalline silicon substrate or a polycrystalline capacitor electrode. The silicon nitride film is then annealed by heating the substrate to a temperature between 700–850° C. then exposing the substrate to an ambient comprising $H_2$ and preferably to a forming gas ambient ($H_2/N_2$ ambient). The anneal step of the present invention anneals out defects at the silicon/silicon nitride interface which helps to prevent charges from becoming trapped at the interface which can lead to poor device performance such as high leakage currents and reduced capacitance. Additionally, annealing the silicon nitride film in a forming gas ambient generally improves the quality of the silicon nitride film by curing defects in the film. By improving the quality of the silicon nitride film, thin, between 10–25 Å, silicon nitride layers can provide robust barrier layers. Additionally, because the quality of the silicon nitride film is subsequently improved with an anneal step, low silicon nitride formation temperatures, less than 950° C., can be used which reduces the thermal budget of a manufacturing process. The anneal process of the present invention enables production of high quality high performance semiconductor devices such as capacitors and transistors.

Figure 1:
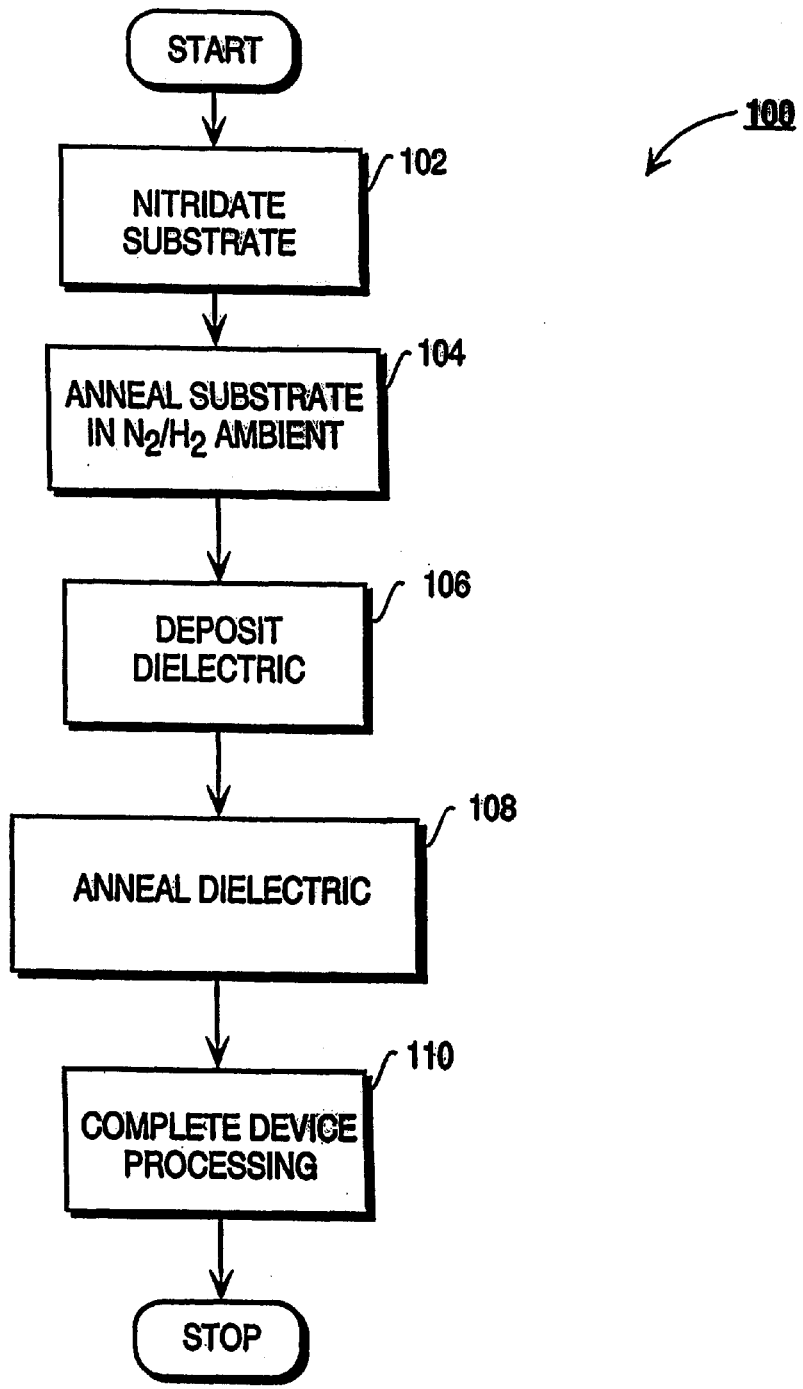
FIG. 1 is a flow chart which illustrates a process of forming a semiconductor device in accordance with the present invention.

A method of fabricating a semiconductor device in accordance with the present invention will be described in reference to FIG. 1 and FIGS. 2a–2e. FIG. 1 illustrates a flow chart which depicts a process of fabricating a semiconductor device in accordance with an embodiment of the present invention. FIGS. 2a–2e illustrate an embodiment of the present invention where the forming gas anneal of the present invention is used in forming a capacitor of a DRAM cell. FIGS. 4a–4e illustrate an embodiment of the present invention where the forming gas anneal of the present invention is used in fabricating a MOS transistor. It is to be appreciated that these specific details are only illustrative of embodiments of the present invention and are not to be taken as limiting to the present invention.

Figure 2A:
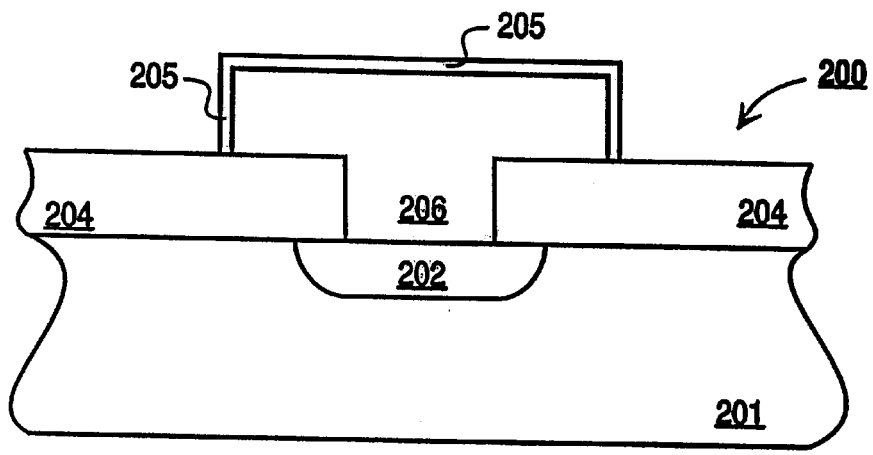
FIG. 2a is an illustration of a cross-section view of a substrate including a interlayer dielectric and a bottom capacitor electrode having a silicon nitride film formed thereon.

In one embodiment of the present invention, the substrate is a substrate used in the fabrication of a dynamic random access memory (DRAM) cells such as substrate 200 shown in FIG. 2a. Substrate 200 includes well known silicon epitaxial substrate 201 having a doped region 202 and a patterned interlayer dielectric 204. A bottom polysilicon capacitor electrode 206 is formed in contact with the diffusion region 202 and over ILD 204. Bottom capacitor electrode 206 can be formed by any well known technique such as by blanket depositing a polysilicon film by chemical vapor deposition (CVD) utilizing a reactive gas comprising silane ($SiH_4$) and $H_2$ and then patterning the blanket deposited material into an electrode with well known photolithography and etching techniques. If bottom electrode 206 will typically be doped to a density between $2-5\times10^{20}$ atoms/$cm^3$. Bottom electrode 206 can also be other types of silicon electrodes capacitor electrodes such as but not limited to hemispherical grained polysilicon (HSG) or "rough poly" electrodes. In still other cases, as is well known in the art, monocrystalline silicon substrate 201 can act as the bottom electrode 206.

The first step, as set forth in block 102 of flow chart 100, is to nitridate substrate 200 to form a thin silicon nitride barrier layer 205 on bottom electrode 206 as shown in FIG. 2a. The purpose of silicon nitride barrier layer 205 is to form an oxidation prevention barrier layer for bottom electrode 206. In this way oxygen cannot penetrate grain boundaries of polysilicon electrode 206 and form oxides therein which can lead to a decrease in the effective dielectric constant of the capacitor dielectric and to an increase in electrode resistance. Because defects, such as pinholes, formed in silicon nitride film 205, are to be subsequently cured by the forming gas anneal of the present invention, a thin, between 10–25 Å, barrier layer can be reliably used. Utilizing a thin silicon nitride layer improves throughput and also reduces the negative capacative impact the silicon nitride layer will have on a capacitor formed with a high dielectric constant such as tantalum pentaoxide ($Ta_2O_5$).

A thin silicon nitride film 205 can be formed by any well know method. For example, silicon nitride film 205 can be formed by thermal nitridation by placing substrate 200 into a low pressure chemical vapor deposition (LPCVD) furnace and heating substrate 200 to a temperature between 800–950° C. and exposing substrate 200 to ammonia gas ($NH_3$). Ammonia ($NH_3$) gas then reacts with exposed silicon surfaces such as polysilicon electrode 206 to form a silicon nitride ($Si_3N_4$) film 205. Alternatively, silicon nitride film 205 can be formed by exposing substrate 200 to highly reactive nitrogen atoms formed by disassociating $NH_3$ or $N_2$ gas with microwaves in a cavity or chamber which is remote from the chamber in which substrate 200 is located. It is to be appreciated, that because the quality of silicon nitride film 205 is to be subsequently improved with the forming gas anneal of the present invention, relatively low, less than 950° C., nitridation temperatures maybe utilized to form silicon nitride film 205. Low nitridation temperatures are desirable because they reduce the thermal budget of the manufacturing process which is becoming increasingly important in the manufacturer of modern high density integrated circuits such as microprocessors and high density dynamic random access memories.

Figure 2B:
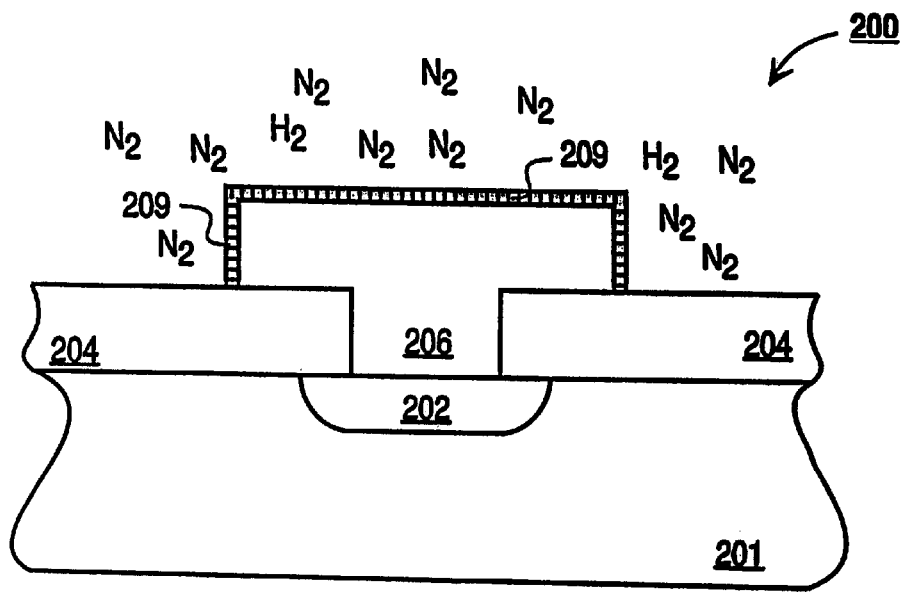
FIG. 2b is an illustration of a cross-sectional view showing the annealing of the substrate of FIG. 2a with an $H_2/N_2$ ambient.

Next, as set forth in block 104 a flow chart 100, substrate 200 is annealed in a forming gas ($N_2/H_2$) ambient to form a high quality annealed silicon nitride layer 209 as shown in FIG. 2b. Substrate 200 can be annealed in accordance with the present invention by placing substrate 200 into a chamber of a rapid thermal processor (RTP) such as a Applied Materials RTP Centura with Honeycomb source and heated to a temperature between 700–850° C. and flowing hydrogen gas ($H_2$) and nitrogen gas ($N_2$) into the chamber to create an ambient which consist of 90–99% $N_2$ and 1–10% $H_2$ by volume. Annealing substrate 200 in a RTP chamber for between 60–180 seconds suitably improves the integrity of the thin silicon nitride barrier layer 205 and improves the interface between barrier layer 205 and polysilicon electrode 206. In one embodiment of the present invention a forming gas ambient is created by flowing 1.0 slm of nitrogen gas ($N_2$) gas and 100 sccm of hydrogen gas ($H_2$) into the chamber of the processor. Although a rapid thermal processor is preferably used to carryout the forming gas anneal of the present invention, the other well known apparatuses such as furnaces maybe used to anneal substrate 200, if desired. In the case of a furnace anneal, substrate 200 can be annealed with a forming gas ($N_2/H_2$) ambient at a temperature between 700–850° C. for approximately 30 minutes.

By heating and exposing substrate 200 to hydrogen gas and nitrogen gas, defects such as pinholes in silicon nitride film 205 are eliminated or substantially reduced. In this way oxygen cannot penetrate through silicon nitride barrier layer 209 and oxidize silicon electrode 206. Additionally, annealing substrate 200 with forming gas provides hydrogen which can defuse through silicon nitride layer 205 and cure defects, such as dangling bonds, at the silicon nitride 205/polysilicon electrode 206 interface which could otherwise trap charges and cause poor device performance such as high leakage currents. Thus, the forming gas anneal of the present invention enables the formation of a thin robust silicon nitride barrier layer 209 and enables the formation of a high quality interface between silicon nitride barrier layer 209 and polysilicon electrode 206.

Although the present invention preferably anneals substrate 200 in a forming gas ($H_2/N_2$) ambient other hydrogen ($H_2$) containing ambients may be utilized. For example substrate 200 can be annealed as described above utilizing ambient comprising hydrogen ($H_2$) and argon (Ar) or to an ambient comprising hydrogen ($H_2$) and helium (He). Additionally, it is also possible to anneal substrate 200 in an ambient consisting of 100% and obtain benefits as described above.

Figure 2C:
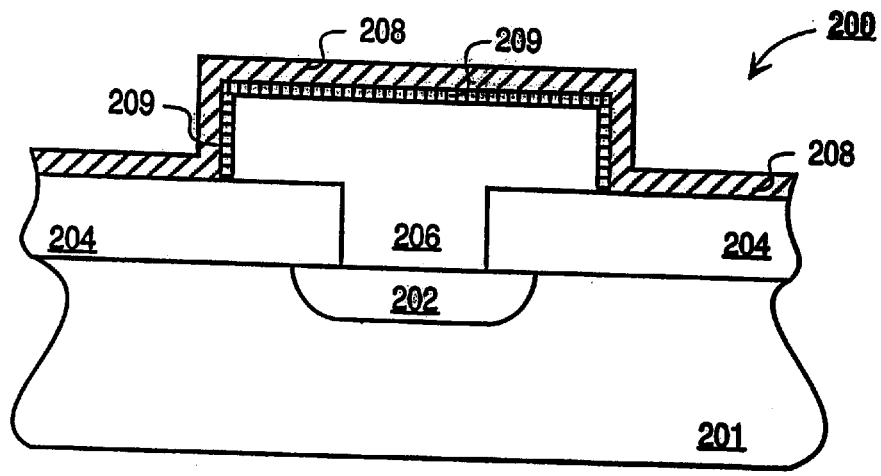
FIG. 2c is an illustration of a cross-sectional view showing the formation of a dielectric film on the substrate of FIG. 2b.
Figure 2D:
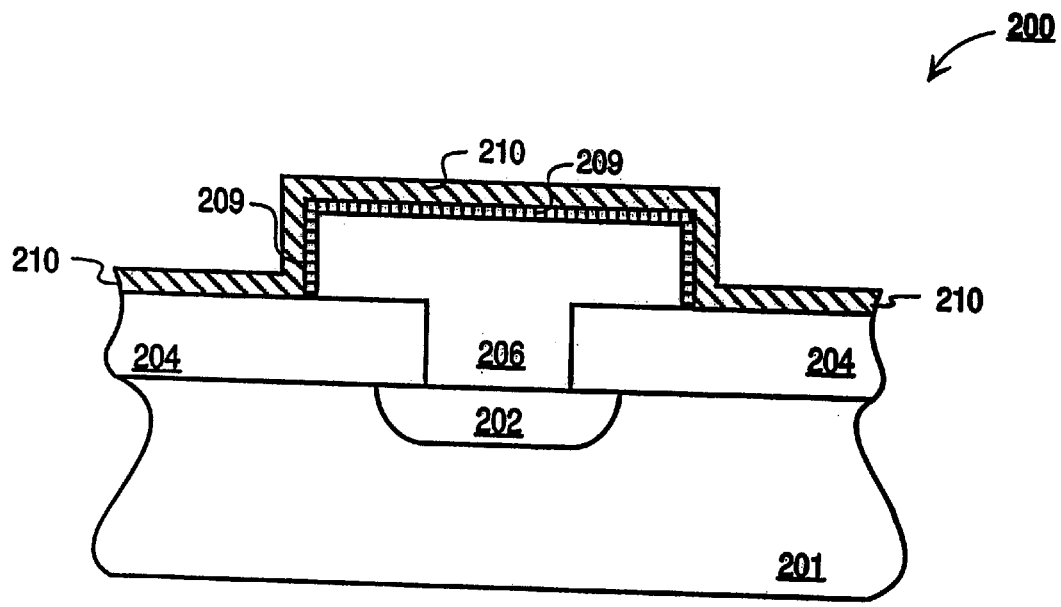
FIG. 2d is an illustration of a cross-sectional view showing the annealing of the dielectric film on the substrate of FIG. 2c.

Next, as set forth in block 106, a dielectric film is formed over substrate 200. In one embodiment of the present invention a high dielectric constant dielectric film 208 is blanket deposited over ILD 204 and annealed silicon nitride film 209 formed on bottom electrode 206 of substrate 200 as shown in FIG. 2c. In a preferred embodiment of the present invention the dielectric film is a transition metal-oxide dielectric film such as, but not limited to, tantalum pentaoxide ($Ta_2O_5$) and titanium oxide ($TiO_2$). In another embodiment dielectric layer 208 is a tantalum pentaoxide film doped with titanium. Additionally dielectric layer 208 can be a composite dielectric film comprising a stack of different dielectric films such as a $Ta_2O_5/TiO_2/Ta_2O_5$ stacked dielectric film. Additionally, dielectric layer 208 can be a piezoelectric dielectric such as Barium Strontium Titanate (BST) and Lead Zerconium Titanate (PZT) or a ferroelectric.

In other embodiments of the present invention dielectric layer 208 can be a silicon-oxide dielectric such as silicon dioxide and silicon oxynitride and composite dielectric stacks of silicon-oxide and silicon nitride film such as well known ONO and NO and nitrided oxides. The fabrication of such oxides are well known and can be used in the fabrication of gate dielectric layers and capacitor dielectrics. For example, a low temperature silicon dioxide film can be formed by chemical vapor deposition utilizing a silicon source, such as TEOS, and an oxygen source, such as $O_2$.

In order to form a dielectric layer 208 onto substrate 200, the substrate can be placed into a thermal process chamber such as the chamber of an Applied Materials CVD single wafer reactor. The substrate is then heated to a desired deposition temperature while the pressure within the chamber is pumped down (reduced) to a desired deposition pressure. Deposition gases are then fed into the chamber and a dielectric layer formed therefrom.

In a preferred embodiment of the present invention dielectric 208 is tantalum pentaoxide ($Ta_2O_5$). To blanket deposit a tantalum pentaoxide ($Ta_2O_5$) dielectric film by thermal chemical vapor deposition a deposition gas mix comprising, a source of tantalum, such as but not limited to, TAETO [$Ta(OC_2H_5)_5$] and TAT-DMAE [$Ta(OC_2H_5)_4(OCHCH_2N(CH_3)_2$], and source of oxygen such as $O_2$ or $N_2O$ can be fed into a deposition chamber while the substrate is heated to a deposition temperature of between 300–500° C. and the chamber maintained at a deposition pressure of between 0.5–10 Torr. The flow of deposition gas over the heated substrate results in thermal decomposition of the metal organic Ta-containing precursor an subsequent deposition of a tantalum pentaoxide film. In one embodiment TAETO or TAT-DMAE is fed into the chamber at a rate of between 10–50 milligrams per minute while $O_2$ or $N_2O$ is fed into the chamber at a rate of 0.3–1.0 SLM. TAETO and TAT-DMAE can be provided by direct liquid injection or vaporized with a bubbler prior to entering the deposition chamber. A carrier gas, such as $N_2$, $H_2$ and He, at a rate of between 0.5–2.0 SLM can be used to transport the vaporized TAETO or TAT-DMAE liquid into the deposition chamber. Deposition is continued until a dielectric film 208 of a desired thickness is formed. A tantalum pentaoxide ($Ta_2O_5$) dielectric film having a thickness between 50 . 200 Å provides a suitable capacitor dielectric.

Next, as set forth in block 108 of flow chart 100, dielectric film 208 can be annealed, if desired, to form an annealed dielectric layer 210 as shown in FIG. 2b. Dielectric layer 210 can be annealed by any well known and suitable annealing process such a rapid thermal anneal or a furnace anneal in an ambient comprising an oxygen containing gas, such as $O_2$ or $N_2O$ a temperature between 800–850° C. Alternatively, dielectric film 208 can be annealed with highly reactive oxygen atoms generated by disassociating an oxygen containing gas, such as $O_2$, with microwaves in a chamber which is remote or separate from the chamber in which substrate 200 is placed during the anneal. An anneal with reactive oxygen atoms which have been remotely generated is ideally suited for annealing a transition metal oxide dielectric film such as a tantalum pentaoxide dielectric ($Ta_2O_5$).

Figure 2E:
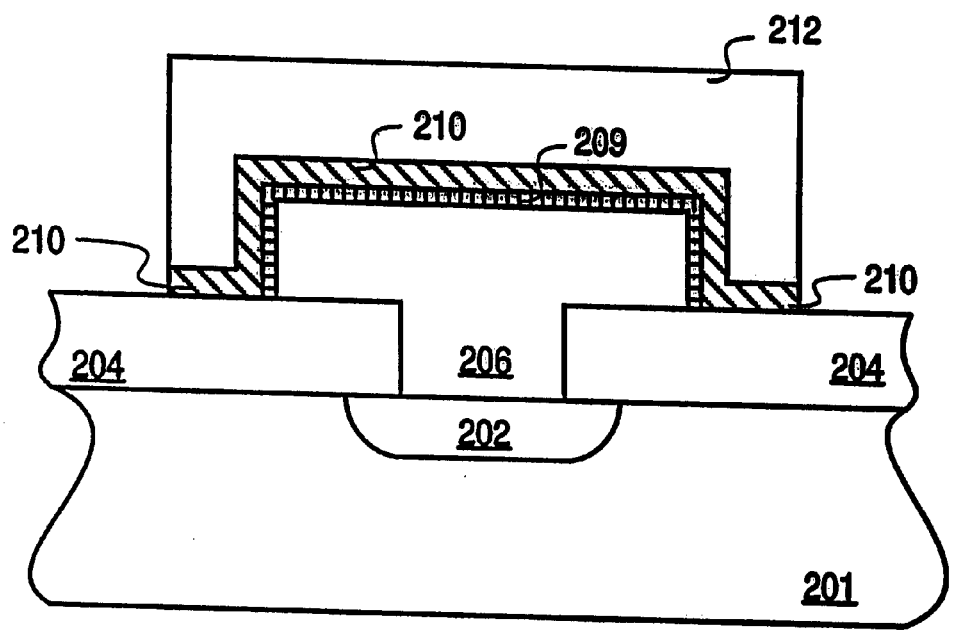
FIG. 2e is an illustration of a cross-sectional view showing the formation of a top capacitor electrode on the substrate o f FIG. 2d.

The next step of the present invention, as set forth in block 110 of flow chart 100 is to complete the processing of the device. For example, as shown in FIG. 2e, a top capacitor electrode 212 can be formed over annealed dielectric layer 210. Any well known technology can be used to form top electrode 212 including blanket depositing a polysilicon film or metal film, such as TiN, over annealed dielectric film 210 and then using well known photolithography and etching techniques to pattern the electrode film and dielectric layer.

Figure 3:
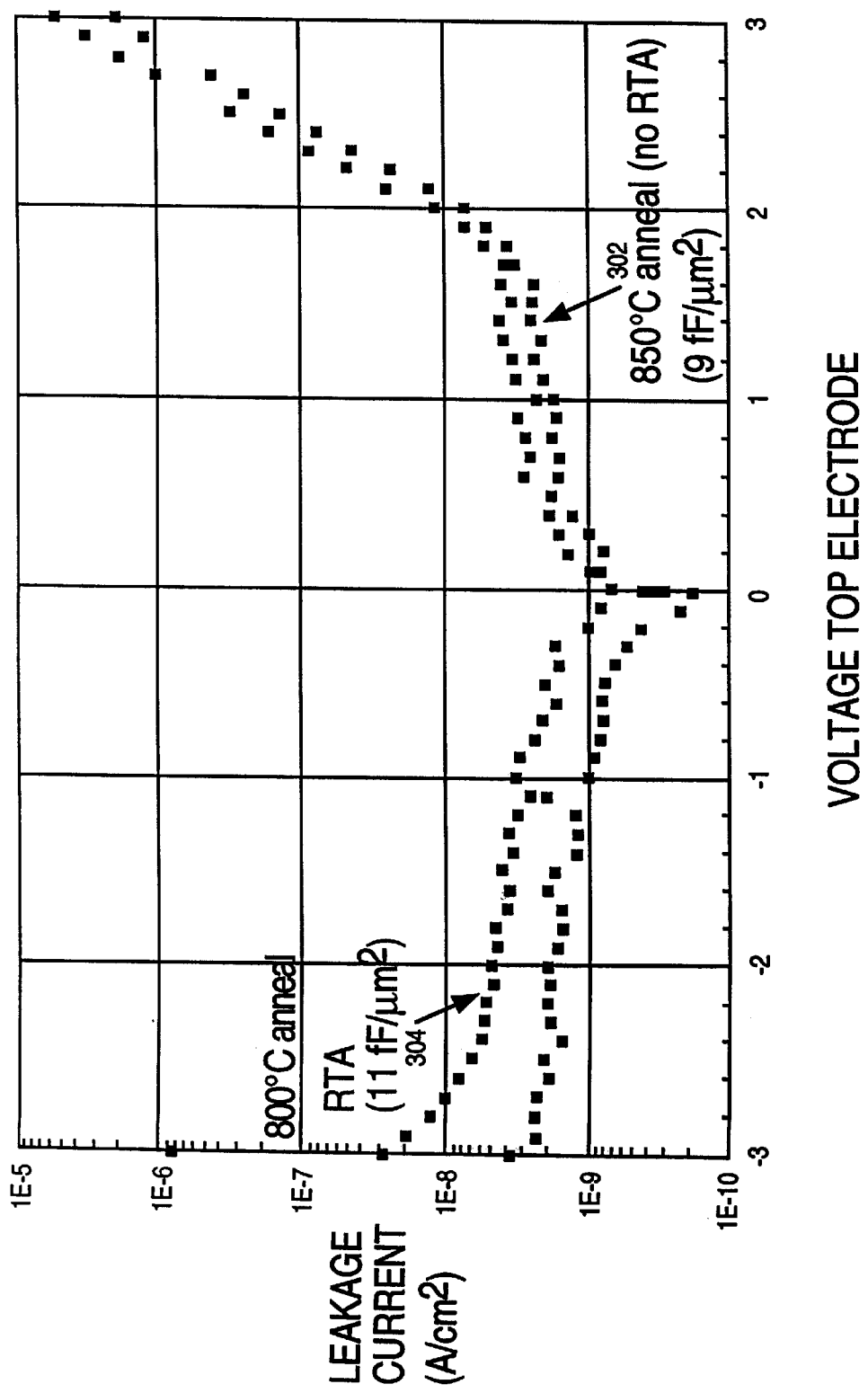
FIG. 3 is a graph which illustrates how leakage current varies for different electrode voltages for a capacitor formed with a unannealed silicon nitride layer and for a capacitor formed with a $H_2/N_2$ annealed silicon nitride layer.

Shown in FIG. 3 are plots which illustrate how annealing silicon nitride layer 205 and bottom electrode 206 in a forming gas ambient enhances the electrical properties of the fabricated capacitor. FIG. 3 illustrates two plots 302 and 304 which show how leakage current varies for different top electrode voltages for capacitors formed with a structure comprising a doped polysilicon bottom electrode, a 20 Å silicon nitride barrier layer, a 100 Å tantalum pentaoxide dielectric which has been annealed in $N_2O$ for 30 seconds, and a titanium nitride top electrode. In plot 302 the silicon nitride film/polysilicon electrode has not been treated with forming gas. As can be seen from the plot 302, the capacitor has good leakage current but has a low capacitance of only 9 fF/$\mu m^2$. The low capacitance is due to the formation of a silicon dioxide layer between the silicon nitride film and the polysilicon electrode. The oxide forms because the poor integrity of the silicon nitride barrier enables oxygen to diffuse through during the tantalum pentaoxide anneal step and cause the formation of silicon dioxide below the silicon nitride layer. Silicon dioxide exhibits a relatively low constant which when placed in series with the high dielectric constant transition metal-oxide dielectric causes a reduction in the effective capacitance of the capacitor. Plot 304 on the other hand shows the electrical characteristics of a capacitor where the polysilicon electrode and silicon nitride layer have been treated with the forming gas anneal of the present invention. As can be seen from plot 304, the forming gas treated capacitor exhibits essentially the same leakage current as the untreated capacitor electrode (the treated capacitor shows slightly higher leakage than the untreated capacitor due to a slightly lower anneal temperature being used for annealing the tantalum pentaoxide film). The capacitor treated with the forming gas however exhibits a significantly higher capacitance of 11 fF/$\mu m^2$. The forming gas treated capacitor exhibits higher capacitance because the silicon nitride barrier is more robust due to the forming gas treatment and therefore oxygen is unable to penetrate it during the tantalum pentaoxide anneal step. Since oxygen penetration is eliminated or substantially reduced a silicon oxide layer is unable to form between the silicon nitride film and the polysilicon electrode. In this way a forming gas treated capacitor exhibits higher capacitance than an untreated capacitor. Additionally, the forming gas anneal of the present invention improves the interface between the silicon nitride layer and the polysilicon gate electrode which helps to improve the capacitance.

Figure 4A:
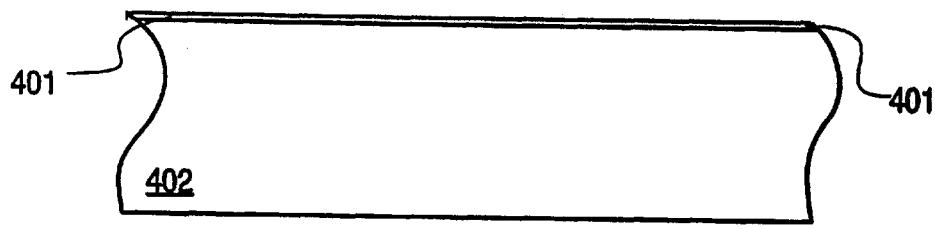
FIG. 4a is an illustration of a cross-sectional view of a substrate having a nitride film formed thereon.
Figure 4B:
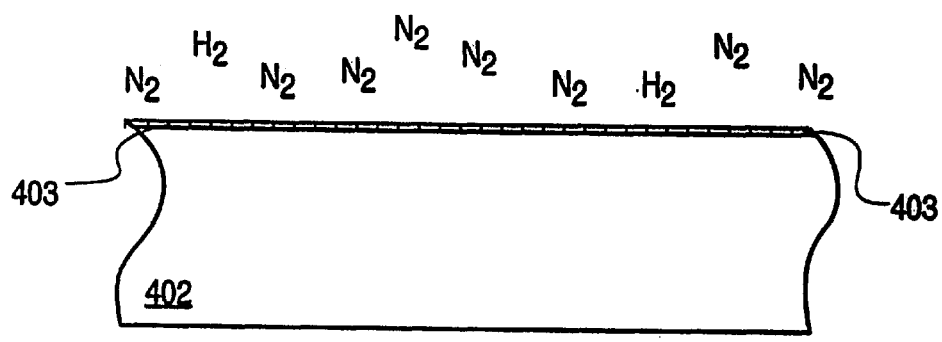
FIG. 4b is an illustration of a cross-sectional view showing the annealing of the substrate of FIG. 4a with a $N_2/H_2$ ambient.
Figure 4C:
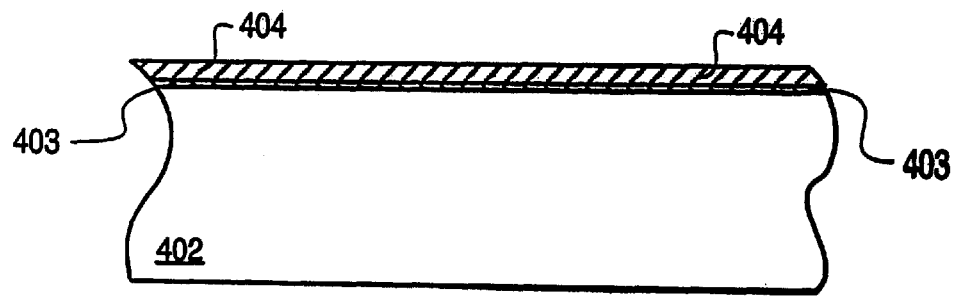
FIG. 4c is an illustration of the cross-sectional view as showing the formation of the dielectric film on the substrate of FIG. 4b.
Figure 4D:
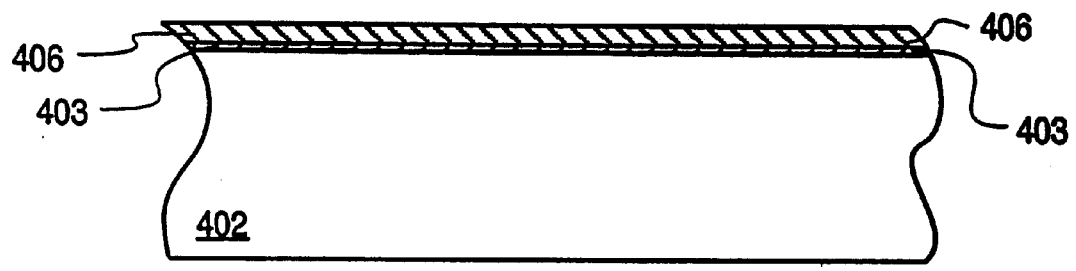
FIG. 4d is an illustration of cross-sectional view showing the annealing of the substrate of FIG. 4c.
Figure 4E:
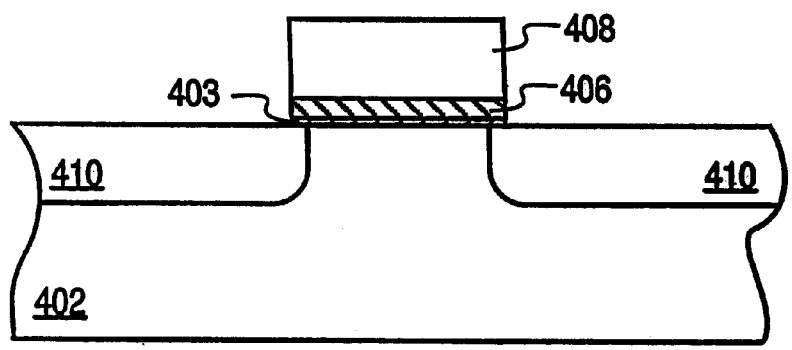
FIG. 4e is an illustration of a cross-sectional view showing the formation of a gate electrode and source/drain regions on the substrate of FIG. 4d.

In another embodiment of the present invention as shown in FIGS. 4a–4e, the forming gas anneal of the present invention is used in fabricating a metal insulator semiconductor (MIS) transistor. The first step as shown in FIG. 4a, is to nitridate a monocrystalline silicon substrate 402 to form a thin, 10–25 Å, silicon nitride film 401 on substrate 402. Next, as shown in FIG. 4b, substrate 400 is annealed with forming gas ($N_2/H_2$) gas as described above to form a robust annealed silicon nitride barrier layer 403 and to cure any defects which may exist at the silicon substrate/silicon nitride interface. Next, as shown in FIG. 4c, a dielectric layer 404 is formed on annealed silicon nitride layer 403. Dielectric layer 404 can be any dielectric film such as a CVD deposited silicon dioxide film, or transition metal oxide film such as tantalum pentaoxide. Dielectric 404 will typically have a thickness between 20–100 Å. Next, as shown in FIG. 4c, dielectric film 404 can be annealed if desired. Next, a gate electrode material, such as polysilicon or metal or combination thereof, can be blanket deposited over annealed dielectric 406 and then patterned into a gate electrode 408 as shown in FIG. 4d with well known photolithography and etching techniques. A pair of source/drain regions 410 can then be formed on opposites sides of gate electrode 408 with well known ion implantation or solid source diffusion techniques in order to complete fabrication of the MOS device.

Thus, a method and apparatus for enhancing the electrical performance of semiconductor devices has been described.

What is claimed is:

1. A method of forming a semiconductor transistor comprising steps of:

exposing a substrate having a silicon nitride film formed on a silicon surface to an ambient comprising hydrogen ($H_2$) and nitrogen ($N_2$) while heating said substrate; and forming a dielectric layer on said ambient exposed silicon nitride film, forming a gate electrode over said dielectric layer; and forming a pair of source/drain regions on opposite sides of said gate electrode.

2. The method of claim 1 wherein said ambient comprises less than 10% hydrogen by volume and more than 90% nitrogen by volume.

3. The method of claim 1 further comprising the step of heating said substrate to a temperature between 700–850° C. while exposing said silicon nitride film to said ambient.

4. The method of claim 1 wherein said silicon surface is a doped polysilicon film.

5. The method of claim 1 wherein said silicon surface monocrystalline silicon.

6. The method of claim 1 wherein said silicon nitride film has a thickness between 10–25 Å.

7. The method of claim 1 wherein said dielectric is a transition metal oxide dielectric.

8. The method of claim 1 wherein said silicon nitride film is exposed aid ambient for between 60–180 seconds.

9. The method of claim 1 further comprising the step of annealing said electric layer.

10. A method of forming a metal insulated semiconductor (MIS) transistor, said method comprising the steps of:

forming a silicon nitride film on a monocrystalline silicon surface of a substrate;

heating said substrate to a temperature between 700-850° C;

while heating said substrate, exposing said substrate to an ambient comprising hydrogen ($H_2$) and nitrogen ($N_2$);

forming a dielectric layer on said ambient exposed silicon nitride layer;

forming a gate electrode over said dielectric layer; and forming a pair of source/drain regions on opposite sides of said gate electrode.

\* \* \* \* \*